(12) United States Patent  
Auciello

(10) Patent No.: US 7,714,405 B2  
(45) Date of Patent: May 11, 2010

(54) LAYERED CU-BASED ELECTRODE FOR HIGH-DIELECTRIC CONSTANT OXIDE THIN FILM-BASED DEVICES

(75) Inventor: Orlando Auciello, Bolingbrook, IL (US)

(73) Assignee: UChicago Argonne, LLC, Chicago, IL (US)

( * ) Notice: Subject to any disclaimer, the term of this patent is extended or adjusted under 35 U.S.C. 154(b) by 725 days.

(21) Appl. No.: 11/073,263

(22) Filed: Mar. 3, 2005

(65) Prior Publication Data

US 2006/0199740 A1    Sep. 7, 2006

(51) Int. Cl.
    *H01L 39/14* (2006.01)
(52) U.S. Cl. ...................................... 257/499
(58) Field of Classification Search .............. 257/499, 257/295, E43.001–E43.007, E27.005–E27.006, 257/E27.008, E29.164, E29.167, E29.272, 257/E29.323, 225–234, 390, E27.076, E21.436, 257/E21.663–E21.665, E21.666–E21.678; 438/3, E21.208, 275–278
    See application file for complete search history.

(56) References Cited

U.S. PATENT DOCUMENTS

| 6,002,174 | A | 12/1999 | Akram et al. |
| 6,373,137 | B1 | 4/2002 | McTeer |
| 6,541,281 | B2 * | 4/2003 | Ramesh ........................ 438/3 |
| 2003/0059959 | A1 * | 3/2003 | Hong ............................ 438/3 |
| 2003/0119271 | A1 * | 6/2003 | Aggarwal et al. ........... 438/381 |
| 2003/0129771 | A1 * | 7/2003 | Summerfelt et al. ........... 438/3 |
| 2003/0227043 | A1 * | 12/2003 | Kutsunai .................... 257/299 |
| 2004/0252590 | A1 * | 12/2004 | Sharma ................... 369/13.05 |

OTHER PUBLICATIONS

"Prairier Chapter of the AVS 2004 Annual Meeting" Jun. 14, 2004, Monday, Frederick Seitz Materials Research Laboratory, University of Illinois at Urbana-Champaign.*

* cited by examiner

*Primary Examiner*—Dao H Nguyen  
*Assistant Examiner*—Tram H Nguyen  
(74) *Attorney, Agent, or Firm*—Olson & Cepuritis, Ltd.

(57) ABSTRACT

A layered device including a substrate; an adhering layer thereon. An electrical conducting layer such as copper is deposited on the adhering layer and then a barrier layer of an amorphous oxide of TiAl followed by a high dielectric layer are deposited to form one or more of an electrical device such as a capacitor or a transistor or MEMS and/or a magnetic device.

16 Claims, 7 Drawing Sheets

LAYERED CU-BASED ELECTRODE FOR HIGH-DIELECTRIC CONSTANT OXIDE THIN FILM-BASED DEVICES

CONTRACTUAL ORIGIN OF THE INVENTION

The United States Government has rights in this invention pursuant to Contract No. W-31-109-ENG-38 between the U.S. Department of Energy and The University of Chicago representing Argonne National Laboratory.

FIELD OF THE INVENTION

This invention relates to a method for producing thin film devices preferably containing copper (Cu) layers and high dielectric oxide layers and the devices incorporating same. More specifically, this invention relates to a method for producing thin oxide-film devices containing layers of Cu as electrodes. Complex oxide film-based devices have many uses such as non-volatile ferroelectric random access memories (FeRAMs), dynamic random access memories (DRAMs), high frequency devices, and many others. Many of these devices include aluminum (Al) and Al-alloy based IC interconnection technologies. Platinum (Pt) is also widely used as the electrode material in ferroelectric and complex oxide thin-film based devices.

BACKGROUND OF THE INVENTION

Copper is drawing much attention as an electrode and interconnect material for integrated sub-micron circuit technology due to its low resistivity and high electro- and stress-mitigation resistance which are superior to Al and Al-alloys. Cu is also a promising candidate to replace Pt due to its low-cost, high conductivity and easier reactive etching properties. However, the successful substitution of Cu into thin-film devices requires the solution to critical issues such as adhesion of Cu layers to Si, $SiO_2$ and ferroelectric layers, Cu diffusion, and elimination of oxidation of the Cu during growth of oxide films. A significant problem is that Cu oxidizes at relatively low temperatures at a significant rate, which results in degradation of the electrical conduction properties of the Cu electrode layers. Thus protection against oxidation is necessary when growing ferroelectric or high permittivity oxide films on Cu electrode layers, since synthesis of those layers requires high temperature and oxygen ambient or oxygen plasmas.

The invention, for preventing oxidation of the copper layer during growth of the oxide layer on the copper layer, is to put down a TiAl oxygen diffusion barrier on top of the copper layer before growing the oxide layer. The TiAl layer absorbs oxygen preferentially binding it to the constituent elements (Ti and Al) of the layer and inhibiting the diffusion of oxygen atoms towards the copper layer while growing the oxide film in an oxygen environment at high temperature. The TiAl oxygen diffusion barrier layer can be deposited by MOCVD, molecular beam epitaxy, atomic layer deposition or physical vapor deposition or any other method suitable for growing oxide thin films.

Various attempts have been made to avoid the problem solved by the present invention, for instance U.S. Pat. No. 6,002,174 issued to Akram et al. Dec. 14, 1999 relates to diffusion barriers but requires the combination of a transition metal such as titanium or aluminum plus silicon plus nitrogen. The patent does not disclose the barrier as effective against oxygen and in fact, nitrogen containing barriers degrade quickly when exposed to oxygen leading to replacement of oxygen in the lattice of the material.

Another attempt at providing barrier materials is disclosed in the McTeer U.S. Pat. No. 6,373,137 issued Apr. 16, 2002. In this patent, McTeer teaches that a TiAl layer is provided but must be annealed in a nitrogen environment to form a TiAl, Cu, N alloy which is susceptible to the same problems associated with the Akram et al. patent. Moreover, as disclosed in the McTeer patent annealing may additionally be performed in an ammonia atmosphere. Accordingly, while various barrier layers have been suggested, none has all the attributes of the amorphous material disclosed herein.

SUMMARY OF THE INVENTION

Accordingly, it is an important object of the present invention to provide multi-layer thin film devices containing copper layers protected by amorphous TiAl oxide and devices incorporating same.

Another object of the present invention is to provide a layered device, comprising a substrate, an adhering layer on the substrate, an electrical conducting layer on the adhering layer, a barrier layer of an oxide of TiAl and a high dielectric layer forming one or more of an electrical device and/or a magnetic device.

Still another object of the present invention is to provide a layered device, comprising a substrate of or containing silicon and/or a compound thereof or of or containing diamond, an adhering layer on the substrate, an electrical conducting layer on the adhering layer, a barrier layer of an amorphous oxide of TiAl; and a high dielectric layer forming one or more of an electrical device and/or a magnetic device.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DETAILED DESCRIPTION OF THE INVENTION

Figure 1:
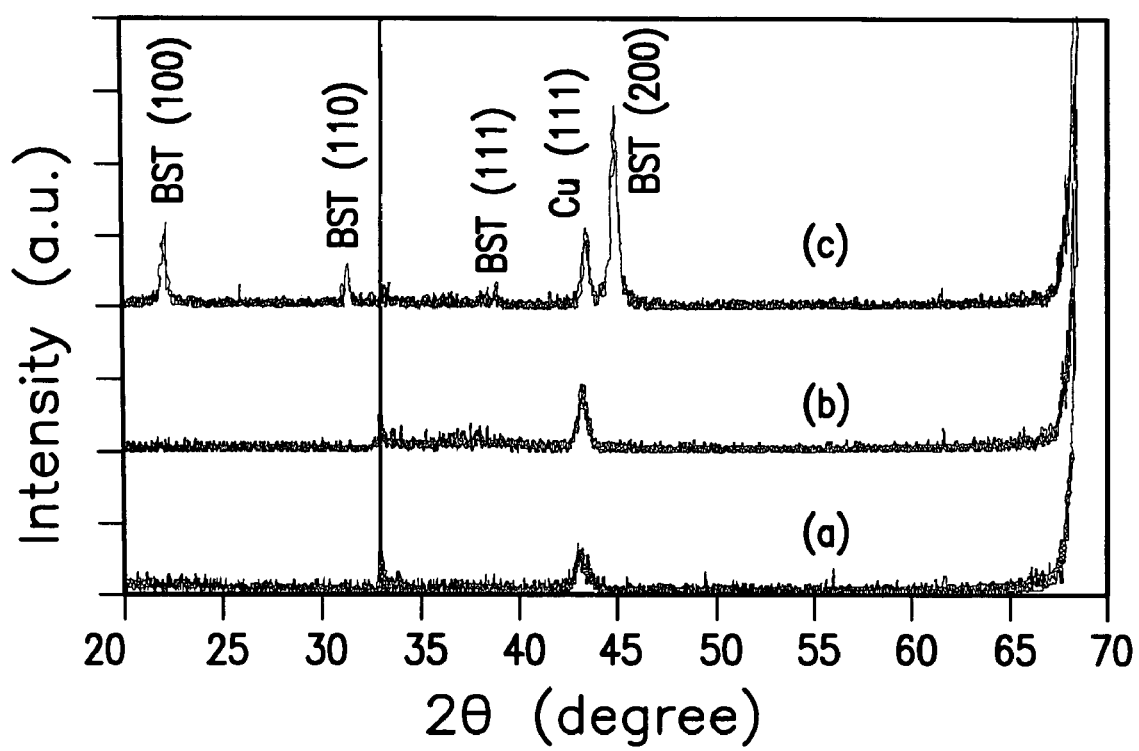
FIG. 1 is a graphical representation of an XRD spectra from Ti—Al/Cu/Ta thin films: (a) as deposited, (b) after oxygen annealing at 600° C., and © after 120 nm BST deposition at 500° C.

A Ti—Al/Cu/Ta multilayer was fabricated on $SiO_2$/Si substrate by ion beam sputtering deposition, to overcome the problems of Cu diffusion and oxidation encountered during the high dielectric constant ($\kappa$) materials integration. The Cu and Ta layers remained intact through the annealing in oxygen environment up to 600° C. The thin oxide layer, formed on the Ti—Al surface, effectively prevented the oxygen penetration toward underneath layers. Complex oxide $(Ba_xSr_{1-x})TiO_3$ (BST) thin films were grown on the layered Ti—Al/Cu/Ta electrodes using RF magnetron sputtering. The deposited BST films exhibited relatively high permittivity (150), low dielectric loss (0.007) at zero bias, and low leakage current<$2\times10^{-8}$ $A/cm^2$ at 100 kV/cm.

Copper is a promising candidate for the replacement of Pt as the electrode material for non-volatile ferroelectric memories and other ferroelectric and complex oxide thin film-based devices, see H. Takasago, K. Adachi, M. Takada, *J. Electron Mater.* 12, 319 (1989) and J. Li, G. Vizekelethy, P. Revez, J. W. Mayer, K. N. Tu, *J. Appl. Phys.* 69, 1020 (1991). However, a successful integration of Cu into the devices described above requires solving several critical issues such as adhesion of Cu layers to Si, $SiO_2$, and ferroelectric layers, Cu diffusion, and perhaps most importantly oxidation during growth of oxide films.

Indeed, there has been a considerable effort to identify a suitable diffusion barrier layer for Cu metallization on semiconductors. Materials such as $Ta_2N$ K. Holloway, P. M. Fryer, C. Cabral, Jr., J. M. E. Harper, P. J. Bailey, J. Appl. Phys. 71, 5433 (1992), Ta P. Catania, J. P. Doyle, J. J. Cuomo, J. Vac. Sci. Technol. A 10, 3318 (1992), W, C. A. Chang, J. Appl. Phys. 67, 6184 (1990), TiW, S. Q. Wang, S. Suthar, C. Hoeflich, B. J. Burrow, J. Appl. Phys. 73, 2301 (1993) and TiN S. Q. Wang, I. J. M. M. Raaijmakers, B. J. Burrow, S. Suthar, S. Redkar, K. B. Kim, J. Appl. Phys. 68, 5176 (1990) have been extensively investigated. Among these materials, tantalum was found to be superior as the diffusion barrier for integration of Cu layers with $SiO_2$/Si substrates, since it not only shows relatively high melting temperature but is also known to be thermodynamically stable with respect to Cu, see Binary Phase Diagram, edited by T. B. Massalski, The Materials Information Society, Materials Park, 1990. On the other hand, Cu has been largely unexplored as metallization for fabrication of oxide thin film-based devices, due mainly to its oxidation problem. Cu oxidizes at relatively low temperatures with a significant rate, which would result in a serious degradation of the electrical conduction of Cu electrode layers. Protection against oxidation is absolutely necessary when growing ferroelectric or high permittivity ($\kappa$) oxide thin films on Cu electrode layers, since the synthesis of those layers requires high temperature and oxygen ambient or oxygen plasmas, see O. Auciello, C. M. Foster, and R. Ramesh, *Annual Review of Materials Science*, edited by O. Auciello and R. Ramesh, 28, 501 (1998), C. A. Paz de Araujo, O. Auciello, and R. Ramesh, in "Science and Technology of Integrated Ferroelectrics: Past Eleven Years of the International Symposium on Integrated Ferroelectrics Proceedings," *Ferroelectricity and Related Phenomena*, (Gordon and Breach Publishers, 2000), 11 xvii. My previous work at Argonne National Laboratory on oxygen diffusion barriers revealed that an amorphous Ti—Al layer exhibits very good diffusion barrier properties against oxygen penetration at elevated temperature. Therefore, I investigated the integration of amorphous Ti—Al, as a reliable protection layer, with Cu for fabrication of oxide thin film-based capacitors.

Although the discussion heretofore has been with respect to copper, other good conductors such as gold, platinum which is now used, silver and tungsten or various good electrically conductive alloys thereof may be used in the layered devices of the subject invention. Copper is preferred because it is inexpensive but even metals such as gold, silver and tungsten can be oxidized at conditions necessary for depositing BST layers. These conditions as well known in the art are often in oxygen atmospheres at elevated temperatures such as 600° C. and frequently result in seriously diminishing the electrical conductivity of the layer.

As previously indicated, there is a significant problem, if copper is the selected electrical conductor and if the substrate is silicon or silicon dioxide, as is usually preferred in many electrical devices, to adhere the copper to silicon or silicon dioxide. A glue or adhesion layer is required between the copper and the silicon or silicon dioxide since copper will not stick on either silicon or silicon dioxide. The preferred layer for providing good adhesion between copper and silicon or silicon dioxide base is tantalum at a preferred thickness in the range of from about 10 nanometers to about 200 nanometers. The thinner the glue layer the better in most if not all circumstances. Alternatives for tantalum are titanium, chromium, the oxide of titanium, tantalum. chromium, various alloys and mixtures thereof or for instance, an amorphous titanium aluminum oxide layer. Amorphous titanium aluminum oxide is also the preferred oxygen diffusion barrier as hereinafter will be set forth.

The Ti—Al (20-50 nm)/Cu (100 nm)/Ta (20 nm) electrode multilayers were grown in an integrated cycle, using an ion beam sputtering system with a rotating multitarget holder to sequentially expose elemental Ta and Cu metal and Ti—Al alloy targets to the Kr ion beam. High-$\kappa$ $(Ba_xSr_{1-x})TiO_3$ (BST) thin films (90-200 nm thick) were subsequently grown on the Cu-based electrodes at substrate temperatures from 400° C. to 600° C., using radio-frequency magnetron sputtering. The stoichiometric $(Ba_{0.5}Sr_{0.5})TiO_3$ target was sputtered with ions from a plasma produced with a mixture of oxygen and argon gas ($O_2$:Ar=1:5) at 40 mTorr of background pressure. Subsequent to the BST film deposition, 100 nm-thick circular Pt top electrodes with 100 mm diameter were grown on the BST film surface via e-beam evaporation through a shadow mask to form metal-insulator-metal (MIM) capacitors.

Four-point probe sheet resistance measurements, x-ray diffraction (XRD), field emission scanning electron microscopy (FE-SEM), Rutherford backscattering spectrometry (RBS), and x-ray photoelectron spectroscopy (XPS) were used to investigate the diffusion and oxidation processes in the Ti—Al/Cu/Ta stacked structure and the crystallographic properties of deposited BST films. The electrical properties of the Pt/BST/Ti—Al/Cu/Ta capacitors were characterized via application of voltage pulses at 10 kHz and 0.1 V rms oscillation, using a Hewlett-Packard 4192A impedance analyzer in conjunction with a Keithley 237 electrometer.

The measured sheet resistivity of an as-deposited Cu-based electrode with 50 nm Ti—Al protection layer was 1.37 $\mu\Omega$-cm, and it did not increase beyond 1.42 $\mu\Omega$-cm through the heating in pure oxygen at atmosphere pressure up to 600° C. On the other hand, the bare Cu/Ta layers completely oxidized at temperature as low as 400° C., resulting in resistivity increase to that of an insulator. Compared with the commonly used Pt electrode, which has an intrinsic bulk resistivity of 10.6 $\mu\Omega$-cm, the Cu-based electrode produced here, with 200 nm Cu layer, exhibited much lower resistivity of 2.6 $\mu\Omega$-cm (close to the 1.7 μΩ-cm value for pure bulk Cu). The measured low resistivity of the Cu-based multilayer structure developed in this work demonstrates that greatly reduced RC constants should be expected for oxide film-based devices with Cu-based electrodes as opposed to equivalent devices with Pt electrodes. The low resistance of the Cu-based electrode after heating in oxygen also indicates that there was no serious interdiffusion between individual layers.

The as-deposited Cu layer in the layered structure was mainly (111) orientated as indicated by the only diffraction peak shown in FIG. 1(a), while the Ta and Ti—Al layers exhibited amorphous phases. The XRD spectrum of the Cu-based electrode layer (FIG. 1(b)) did not change much after oxygen annealing at 600° C. Cu remained metallic, showing (111) diffraction peak with slightly higher intensity, and no sign of copper or tantalum oxidation was detected by XRD. Moreover, neither Ti—Al nor $TiO_2/Al_2O_3$ grain formation through the heating process has been revealed by the XRD analysis. Since grain boundaries generally provide paths for oxygen diffusion, the amorphous Ti—Al layer is a better diffusion resistance than a polycrystalline film, S. Aggarwal, A. M. Dhote, H. Li, S. Ankem, R. Ramesh, Appl. Phys. Lett. 74, 230 (1999). The presence of BST (100), (110), and (111) diffraction peaks in FIG. 1(c) indicates that the BST thin film grown on the Ti—Al/Cu/Ta electrode is polycrystalline. Again, only metallic Cu diffraction peak was observed indicating that the amorphous Ti—Al oxide diffusion barrier protects the Cu and underneath layers from oxidation.

Figure 2A:
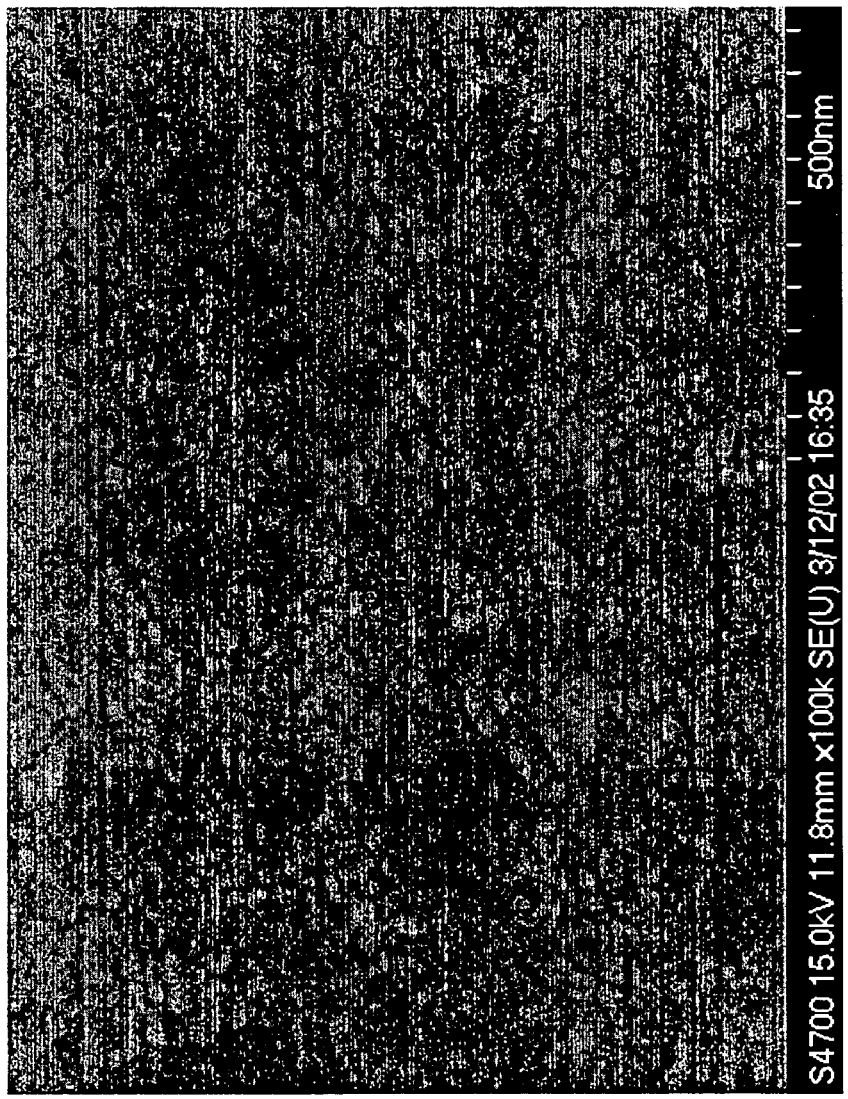
FIG. 2a is a plan-view and cross-sectional view showing a smooth surface topography and sharp interfaces between layers.
Figure 2B:
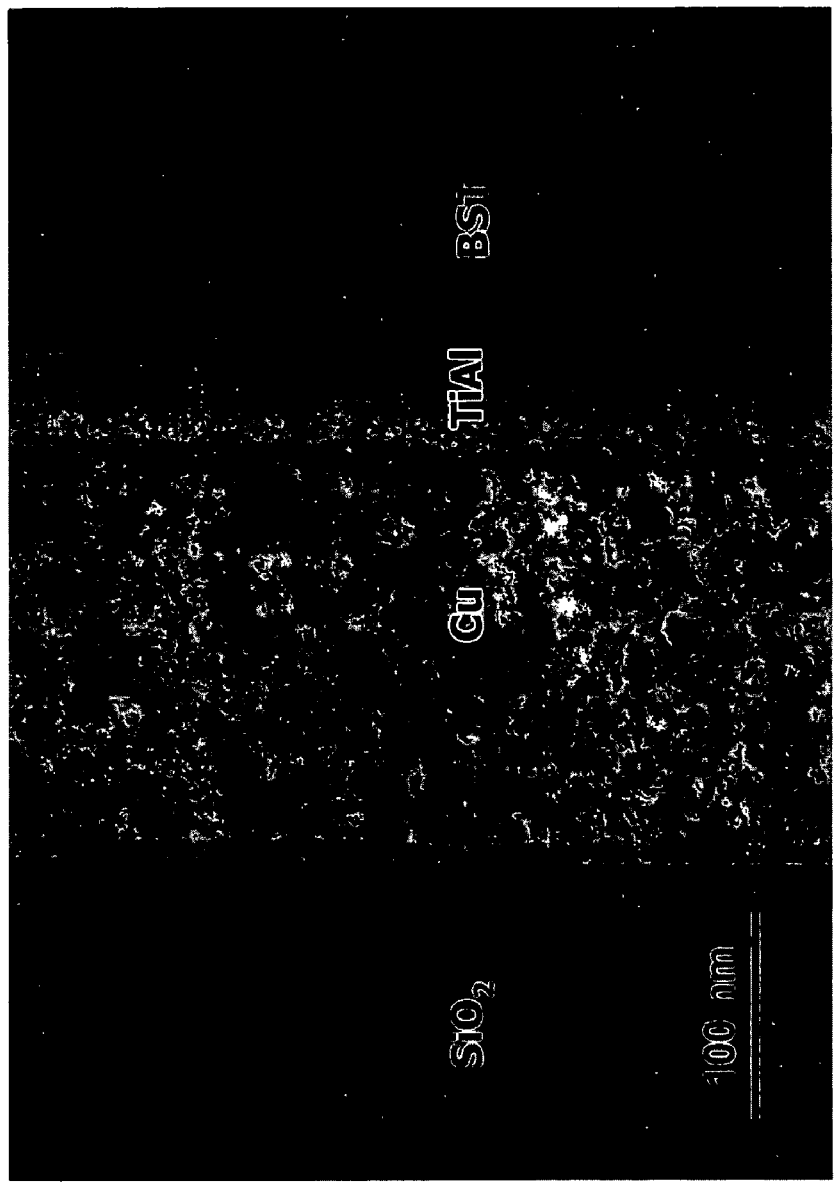
FIG. 2(b) is a plan-view and cross-sectional view showing FE-SEM images of BST/Ti—Al/Cu/Ta/$SiO_2$/Si stacked structure, showing a smooth surface topography and sharp interfaces between layers.

The XRD spectra shown above are consistent with the FE-SEM observation (FIG. 2(a)), which shows a smooth and continuous BST thin film with a microstructure characterized by ~100 nm grains. The SEM cross-section view of the BST layer, shown in FIG. 2(b), reveals sharp interfaces in the layered structure of the BST/Ti—Al/Cu/Ta/$SiO_2$/Si sample. Normally, the Cu or Ta oxidation may occur at the place where Ti—Al protection layer fails, such as grain boundary or local defects. The oxygen atoms, that penetrate the Ti—Al film through those active diffusion paths, would consume the surrounding Cu and Ta layers with considerable rate at the BST growth temperatures. Then, hillock or particle formation would be observed at those locations. The almost featureless BST surface morphology indicates the integrity of Cu and Ta layers provided by the amorphous Ti—Al protection layer.

Figure 3:
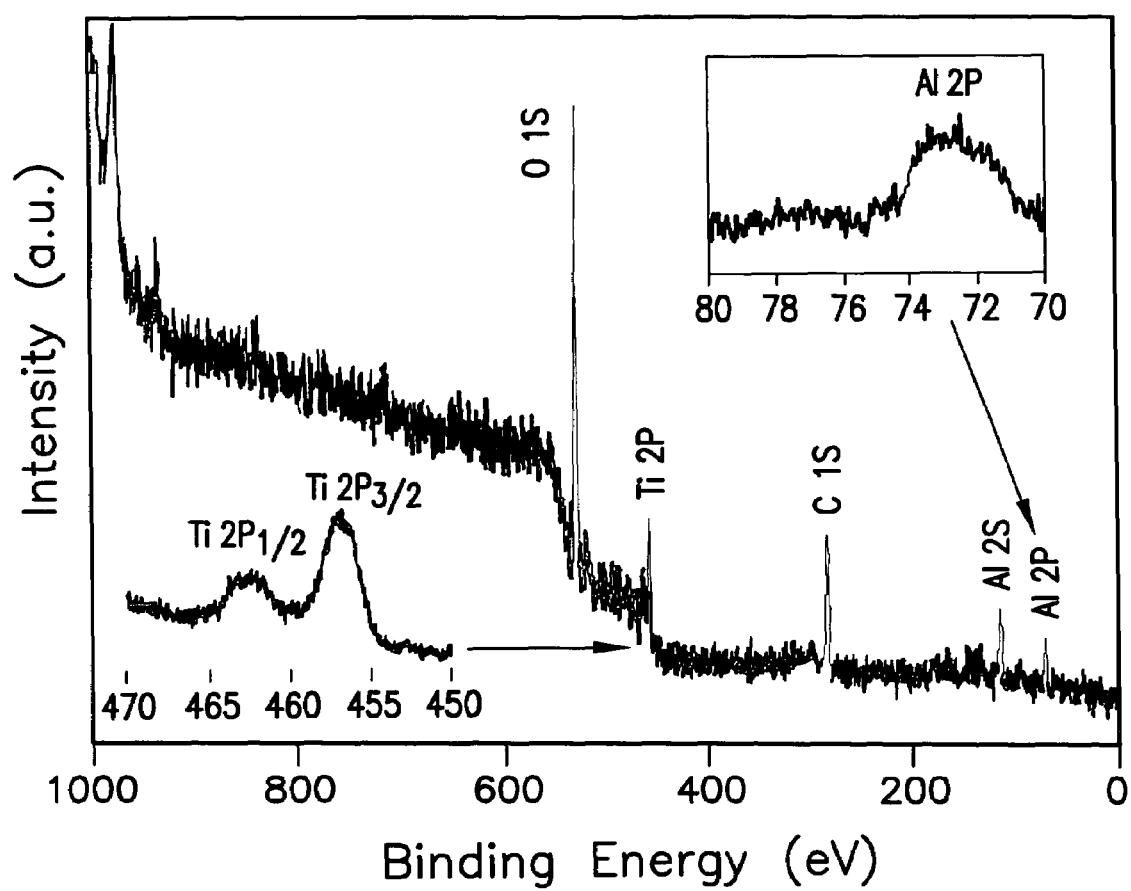
FIG. 3 is a graphical representation of an XPS spectrum from Ti—Al/Cu/Ta multilayers after annealing in oxygen at 600° C. for 30 min.

The oxidation resistance of the Ti—Al/Cu/Ta electrode was further investigated using XPS. The chemical states of the surface Ti and Al atoms illustrated the role of Ti—Al in protecting the underlying Cu and Ta layers. XPS analysis (FIG. 3) of the Ti—Al/Cu/Ta sample after heating in oxygen at 600° C. shows Al 2p, Ti $2p_{1/2}$, and Ti $2p_{3/2}$ photoelectron peaks with the binding energies of 74.8 eV, 464.2 eV, and 458.9 eV respectively, which correspond to their oxide states. The formations of $TiO_2$ and $Al_2O_3$ are thermodynamically favorable compared with $Cu_2O$, due to the large differences in oxide formation energy between Ti (−210 kcal/g·$molO_2$), Al (−226 kcal/g·$molO_2$) and Cu (−53 kcal/g·$molO_2$) at 500° C. It explains the coexistence of oxidized Ti—Al and metallic Cu at elevated temperature. In addition, it is well known that the Al self-protection to oxidation is due to a dense monolayer of $Al_2O_3$ layer formed on the surface, which stops further oxygen diffusion. This mechanism appears to be also effective in the ability of amorphous Ti—Al to function as good oxygen diffusion barriers to protect the underlying Cu and Ta layers.

Figure 4:
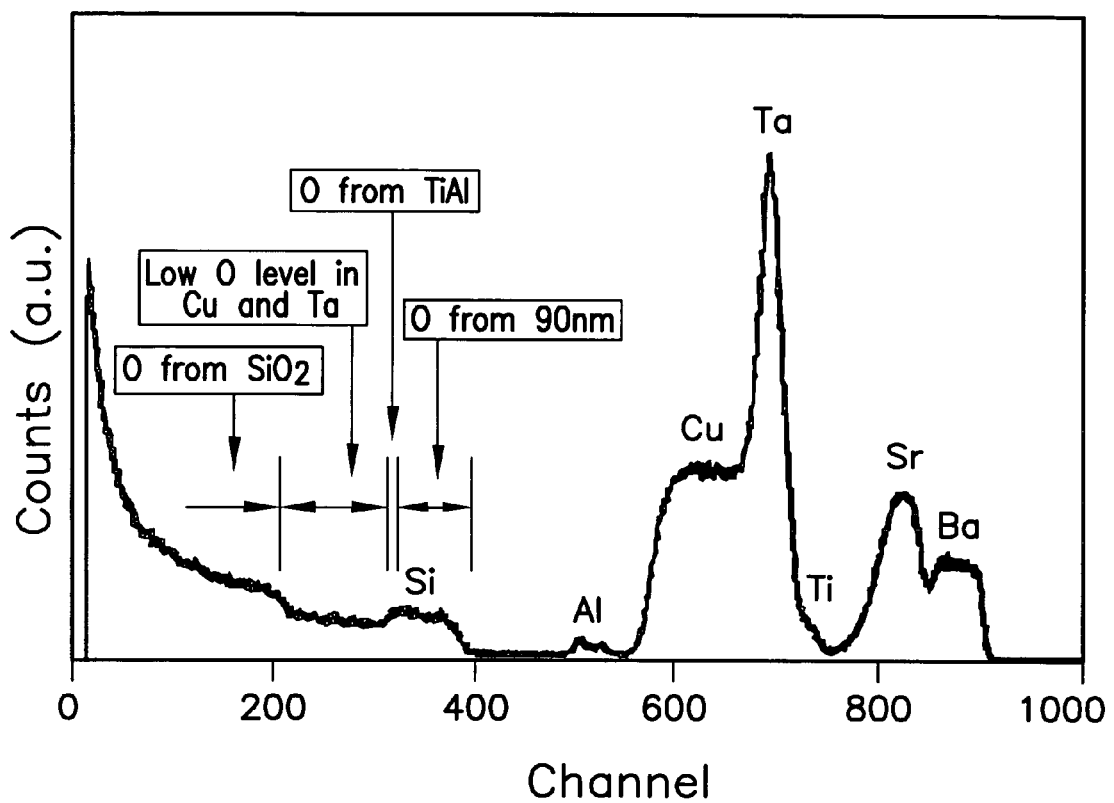
FIG. 4 is a graphical representation of a RBS spectrum from a 90 nm BST thin film grown on a Ti—Al (20 nm)/Cu (100 nm)/Ta (20 nm) electrode.

Rutherford backscattering (RBS) analysis was performed with 1.5 MeV $He^+$ ions at a scattering angle of 137° to evaluate the interaction between different layers. The RBS spectrum (FIG. 4) clearly shows a discrete layer structure of 90 nm BST thin film grown on Ti—Al/Cu/Ta. No detectable level of Cu diffusion through the Ta layer into $SiO_2$/Si substrates was observed. The RBS spectrum also indicates that the amount of oxygen that may be included in both the Cu and Ta layers is very small. A computer simulation of the RBS spectrum revealed that the top oxygen signal, appearing as a plateau added on the Si signal, is slightly wider than the one generated from the BST layer. It confirmed the XPS results that the Ti—Al layer was partially oxidized during the BST fabrication, and that the oxide layer functioned as an oxygen diffusion barrier to protect the bulk of the Ti—Al and underlying Cu/Ta layers.

Both C-V and I-V measurements of the fabricated Pt/BST/Ti—Al/Cu/Ta capacitors are consistent with the previous XRD and RBS analysis, indicating the integrity of the metallic multilayers. The measured permittivity for capacitors with 90 nm BST thin films grown at 500° C. is 110 at zero bias and 10 kHz, and the capacitor leakage current density is in the range of $10^{-7}$ A/$cm^2$ at 100 kV/cm. This relatively low permittivity of obtained BST film, compared to the one grown on Pt, is mainly due to the formation of the thin oxidized Ti—Al interfacial layer, which has dielectric constant of 31. It is expected that a thicker BST film will be influenced less by the interfacial layer, since the electrical behavior is described by two capacitors in series. As a result, the sample with 120 nm BST layer achieved 150 and 0.007 as the measured permittivity and loss, respectively, while the leakage current density was <$2\times10^{-8}$ A/$cm^2$ at 100 kV/cm. Further studies to understand the Cu-based electrode interfaces are in progress.

Ti—Al/Cu/Ta multilayers enable the use of Cu as a base electrode material for the fabrication of high-κ thin film-based capacitors. The Cu and Ta layers remained intact through high temperature oxygen annealing, due to the thin oxide layer formed on the Ti—Al surface effectively preventing the oxygen diffusion toward underneath layers. Polycrystalline $(Ba_xSr_{1-x})TiO_3$ layers were successfully deposited on Ti—Al/Cu/Ta stacked structure at 500° C., exhibiting high dielectric constant and low leakage density. These results demonstrate that the Ti—Al/Cu/Ta layered structure provides a good alternative electrode technology to Pt for the fabrication of BST capacitors suitable for DRAMs and high frequency devices. In addition, the Cu-based electrode technology is applicable to integration of many other ferroelectric and complex oxide thin film-based devices, which require high-temperature and oxygen content growth condition as for the case of BST film fabrication.

As seen therefore, there has been provided a layered device including, but not limited to, BST based capacitors. The Si and $SiO_2$ layers are well known in the art and may be of any useful thickness. The Ta layer generally has a thickness in the range of from about 10 nanometers to about 100 nanometers, but is also well known in the art and any useful thickness may be employed. The Cu layer generally has a thickness in the range of from 200 nanometers to about 1000 nanometers, but thicker Cu layers are useful and well known in the art. The amorphous Ti—Al layer is preferably in the range of from about 30 nanometers to about 50 nanometers in thickness but generally less than 200 nanometers does not require annealing to protect the Cu layer in the present invention. The Ti—Al ratio may be Ti rich or Al rich but preferably is 1:1. Although a Barium Strontium Titanate (BST) High-Dielectric Constant Oxide thin film has been disclosed any ferroelectric material may be used, such as, but not limited to, Ba based ferroelectrics, Pb, based ferroelectrics or Bi based ferroelectrics and specifically lead zirconium titinate or strontium bismuth titinate or other well known high dielectric constant oxides.

Although the layered device of the subject invention has been described with respect to a substrate of silicon or silicon dioxide, a variety of other substances may be useful such as a diamond or nanocrystalline diamond. The layered device of the present invention has been described specifically with respect to a capacitor but it may be a transistor or a variety of electrical and/or magnetic devices. The layered device of the present invention has particular applicability in microelectromechanical systems (MEMS) particularly MEMS devices actuated by a piezoelectric oxide such as cantilevers and the like.

Figure 5:
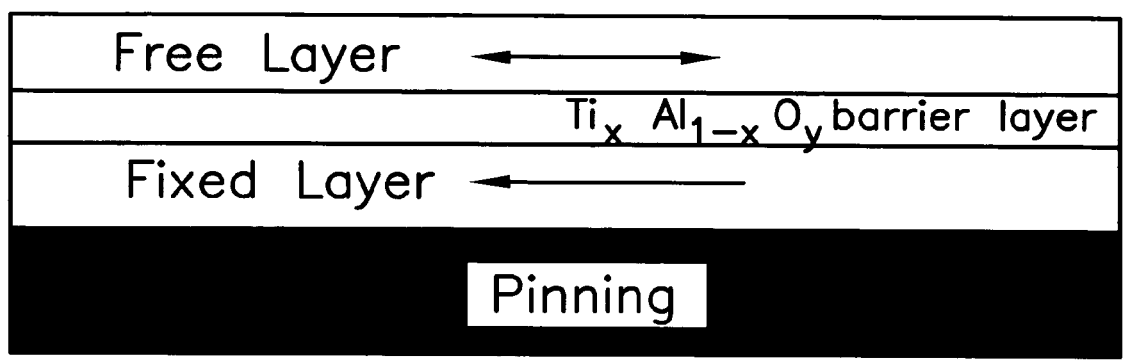
FIG. 5 is a simplified schematic of a magnetic tunnel junction for an MRAM.

Referring to FIG. 5, there is shown a simplified schematic of a tunnel junction for an MRAM. The pinning layer made from an antiferromagnetic alloy (e.g. IrMn or PtMn) forces the magnetization direction of the fixed layer to orient in a certain direction indicated by the single headed arrow. While the free layer is free to adopt any of two orientations indicated by the double headed arrow. Stable magnetic states occur when the free layer is either parallel or antiparallel to the fixed layer. The resistance of the memory cell to a current flowing perpendicular through the layer stack, and tunneling through the $Ti_xAl_{1-x}O_y$ barrier layer is low for the parallel state and high for the antiparallel state, which provide the two states of binary memory.

As seen, the $Ti_xAl_{1-x}O_y$ barrier can be used in magnetic random access memories (MRAM) where two magnetic layers (either made of magnetic metal or magnetic oxides) are separated by an extremely thin (~15 Å) dielectric layer. This thin layer separates the two ferromagnetic layers mentioned above and it is thin enough to allow electrons to tunnel through it and provide the MRAM functionality as hereinbefore described. The barrier layer needs to be of a dielectric layer very stable to temperature excursions and produced in such a way that there is minimum inter-diffusion of material between the magnetic layers and the barrier layer. The room temperature process developed and described herein for the amorphous TiAl oxide layer enables this integration.

Figure 6:
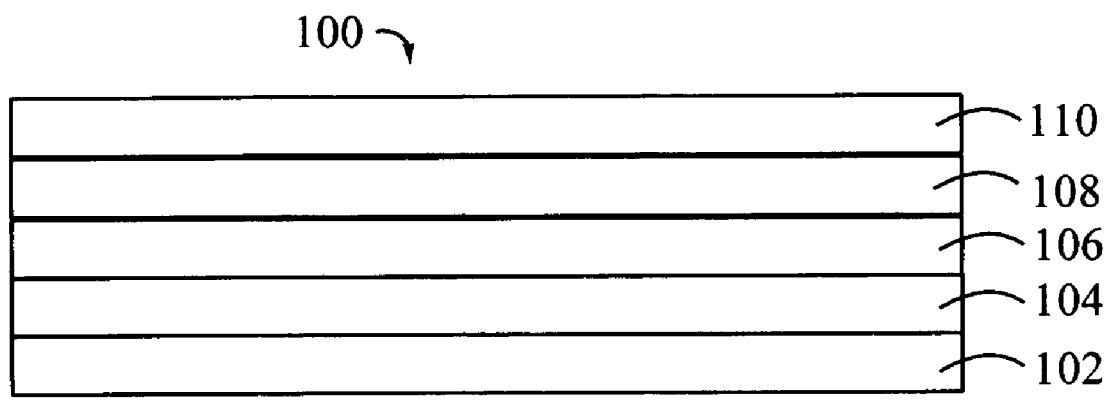
FIG. 6 is a simplified schematic of a layered device made in accordance with the present invention.

FIG. 6 is a simplified schematic representation of a layered device 100 made in accordance with the present invention in which the substrate 102 may be silicon or silicon oxide as previously discussed, an adhering layer 104 on the substrate may be tantalum or the various materials previously discussed, the electrical conducting layer 106 on the adhering layer may be copper or the various materials previously discussed, the barrier layer 108 on the conducting layer is titanium aluminum and the high dielectric layer 110 on the barrier layer is BST or other high dielectric material previously discussed.

While the invention has been particularly shown and described with reference to a preferred embodiment hereof, it will be understood by those skilled in the art that several changes in form and detail may be made without departing from the spirit and scope of the invention.

The embodiments of the invention in which an exclusive property or privilege is claimed are defined as follows:

1. A layered device, comprising a substrate; an adhering layer of tantalum on said substrate; an electrical conducting layer of copper on said adhering layer; a barrier layer of amorphous TiAl on the underlying layer of copper; and a high dielectric layer on the layer of amorphous TiAl, forming one or more of an electrical device and/or a magnetic device.

2. The device of claim 1, wherein said substrate is silicon or compound thereof.

3. The device of claim 1, wherein said substrate is diamond.

4. The device of claim 1, wherein said substrate is nanocrystalline diamond.

5. The device of claim 1, wherein said adhering layer has a thickness in the range of from about 10 nanometers (nm) to about 50 nm.

6. The device of claim 1, wherein said electrical conducting layer is not less than about 100 nm thick.

7. The device of claim 1 wherein said barrier layer is less than about 200 nm in thickness.

8. The device of claim 1, wherein said high dielectric layer has a thickness in the range of from about 50 nm to about 300 nm.

9. The device of claim 1 wherein said high dielectric layer is a ferroelectric material.

10. The device of claim 9, wherein said high dielectric layer is one or more of a Ba based ferroelectric material or Pb based ferroelectric material or a Bi based ferroelectric material.

11. The device of claim 10, wherein said high dielectric material is one or more of BST or PZT or SBT.

12. A layered device, comprising a substrate of or containing silicon and/or a compound thereof or of or containing diamond; an adhering layer of tantalum on said substrate; an electrical conducting layer of copper on said adhering layer; a barrier layer of amorphous TiAl on the underlying layer of copper; and a high dielectric layer on the amorphous TiAl barrier layer, forming one or more of an electrical device and/or a magnetic device.

13. The layered device of claim 12, wherein said barrier layer is less than about 200 nm in thickness.

14. The layered device of claim 12, wherein said high dielectric layer has a thickness in the range of from about 50 nm to about 300 nm and is a ferroelectric material.

15. The layered device of claim 14, wherein said high dielectric layer is one or more of a Ba based ferroelectric material or Pb based ferroelectric material or a Bi based ferroelectric material.

16. The layered device of claim 7, wherein said high dielectric material is one or more of BST or PZT or SBT.

* * * * *